(12) United States Patent
Anderson et al.

(10) Patent No.: US 10,319,852 B2
(45) Date of Patent: Jun. 11, 2019

(54) FORMING EDRAM UNIT CELL WITH VFET AND VIA CAPACITANCE

(71) Applicant: INTERNATIONAL BUSINESS MACHINES CORPORATION, Armonk, NY (US)

(72) Inventors: Brent A. Anderson, Jericho, VT (US); Huiming Bu, Glenmont, NY (US); Xuefeng Liu, Schenectady, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/671,589

(22) Filed: Aug. 8, 2017

(65) Prior Publication Data

US 2018/0211963 A1    Jul. 26, 2018

Related U.S. Application Data

(62) Division of application No. 15/414,696, filed on Jan. 25, 2017, now Pat. No. 9,991,267.

(51) Int. Cl.
| | |
|---|---|
| *H01L 27/108* | (2006.01) |
| *H01L 29/78* | (2006.01) |

(Continued)

(52) U.S. Cl.
CPC .... *H01L 29/7827* (2013.01); *H01L 21/31133* (2013.01); *H01L 27/1082* (2013.01); *H01L 27/1085* (2013.01); *H01L 27/10826* (2013.01); *H01L 27/10858* (2013.01); *H01L 27/10867* (2013.01); *H01L 27/10879* (2013.01);
(Continued)

(58) Field of Classification Search
CPC ......... H01L 27/10829; H01L 27/10832; H01L 27/10838; H01L 27/10847; H01L 27/10861; H01L 27/10876; H01L 21/31133; H01L 27/10873;
(Continued)

(56) References Cited

U.S. PATENT DOCUMENTS

| | | | | |
|---|---|---|---|---|
| 5,382,816 A | * | 1/1995 | Mitsui ............... | H01L 27/10841 257/265 |
| 5,444,278 A | * | 8/1995 | Katayama ......... | H01L 27/10808 257/296 |

(Continued)

OTHER PUBLICATIONS

List of IBM Patents or Patent Applications Treated as Related dated Aug. 8, 2017, 2 pages.

*Primary Examiner* — Bitew A Dinke
(74) *Attorney, Agent, or Firm* — Tutunjian & Bitetto, P.C.; Vazken Alexanian

(57) ABSTRACT

A method is presented for forming an embedded dynamic random access memory (eDRAM) device. The method includes forming a FinFET (fin field effect transistor) device having a plurality of fins over a substrate and forming a via cap adjacent the FinFET device by forming a contact trench extending into a bottom spacer, depositing a conductive liner within the contact trench, filling the contact trench with an organic dielectric layer (ODL), etching portions of the conductive liner and a portion of the ODL, and removing the ODL. The method further includes depositing a high-k material within the contact trench and depositing a conducting material over the high-k material.

15 Claims, 13 Drawing Sheets

(51) Int. Cl.
*H01L 49/02* (2006.01)
*H01L 21/311* (2006.01)
*H01L 29/66* (2006.01)

(52) U.S. Cl.
CPC ........ *H01L 28/60* (2013.01); *H01L 29/66666* (2013.01); *H01L 29/785* (2013.01)

(58) Field of Classification Search
CPC ........... H01L 27/10867; H01L 29/7827; H01L 27/10864; H01L 29/66666; H01L 28/60
See application file for complete search history.

(56) References Cited

U.S. PATENT DOCUMENTS

| | | | | |
|---|---|---|---|---|
| 5,929,477 | A * | 7/1999 | McAllister Burns, Jr. | H01L 27/10864 257/296 |
| 6,177,699 | B1 * | 1/2001 | Perng | H01L 21/76237 257/303 |
| 8,723,243 | B2 | 5/2014 | Messenger et al. | |
| 9,343,464 | B2 | 5/2016 | Erickson et al. | |
| 2004/0219798 | A1 * | 11/2004 | Chang | H01L 27/10864 438/723 |
| 2006/0046391 | A1 * | 3/2006 | Tang | H01L 27/10876 438/268 |
| 2009/0114978 | A1 * | 5/2009 | Cha | H01L 29/1083 257/327 |
| 2009/0256185 | A1 * | 10/2009 | Cheng | H01L 21/84 257/301 |
| 2010/0078712 | A1 * | 4/2010 | Ikebuchi | H01L 21/823487 257/329 |
| 2010/0270611 | A1 * | 10/2010 | Masuoka | H01L 21/823885 257/329 |
| 2011/0012193 | A1 * | 1/2011 | Nojima | H01L 29/66666 257/329 |
| 2013/0062677 | A1 * | 3/2013 | Li | H01L 21/84 257/301 |
| 2013/0146957 | A1 * | 6/2013 | Cheng | H01L 27/1203 257/301 |
| 2013/0175596 | A1 * | 7/2013 | Cheng | H01L 27/0629 257/310 |
| 2013/0320422 | A1 * | 12/2013 | Chang | H01L 27/10826 257/301 |
| 2014/0054664 | A1 * | 2/2014 | Messenger | H01L 21/84 257/301 |
| 2014/0070292 | A1 * | 3/2014 | Cheng | H01L 21/84 257/301 |
| 2014/0210039 | A1 | 7/2014 | Kwon et al. | |
| 2014/0291616 | A1 * | 10/2014 | Park | H01L 29/66356 257/27 |
| 2015/0206885 | A1 * | 7/2015 | Barth, Jr. | H01L 27/10826 257/301 |
| 2015/0294984 | A1 * | 10/2015 | Cheng | H01L 27/10826 257/347 |
| 2016/0126245 | A1 * | 5/2016 | Liu | H01L 27/1087 438/241 |
| 2016/0148872 | A1 * | 5/2016 | Ok | H01L 23/535 257/401 |
| 2016/0181353 | A1 * | 6/2016 | Ando | H01L 23/26 257/534 |
| 2017/0162557 | A1 * | 6/2017 | Moll | H01L 27/0222 |

* cited by examiner

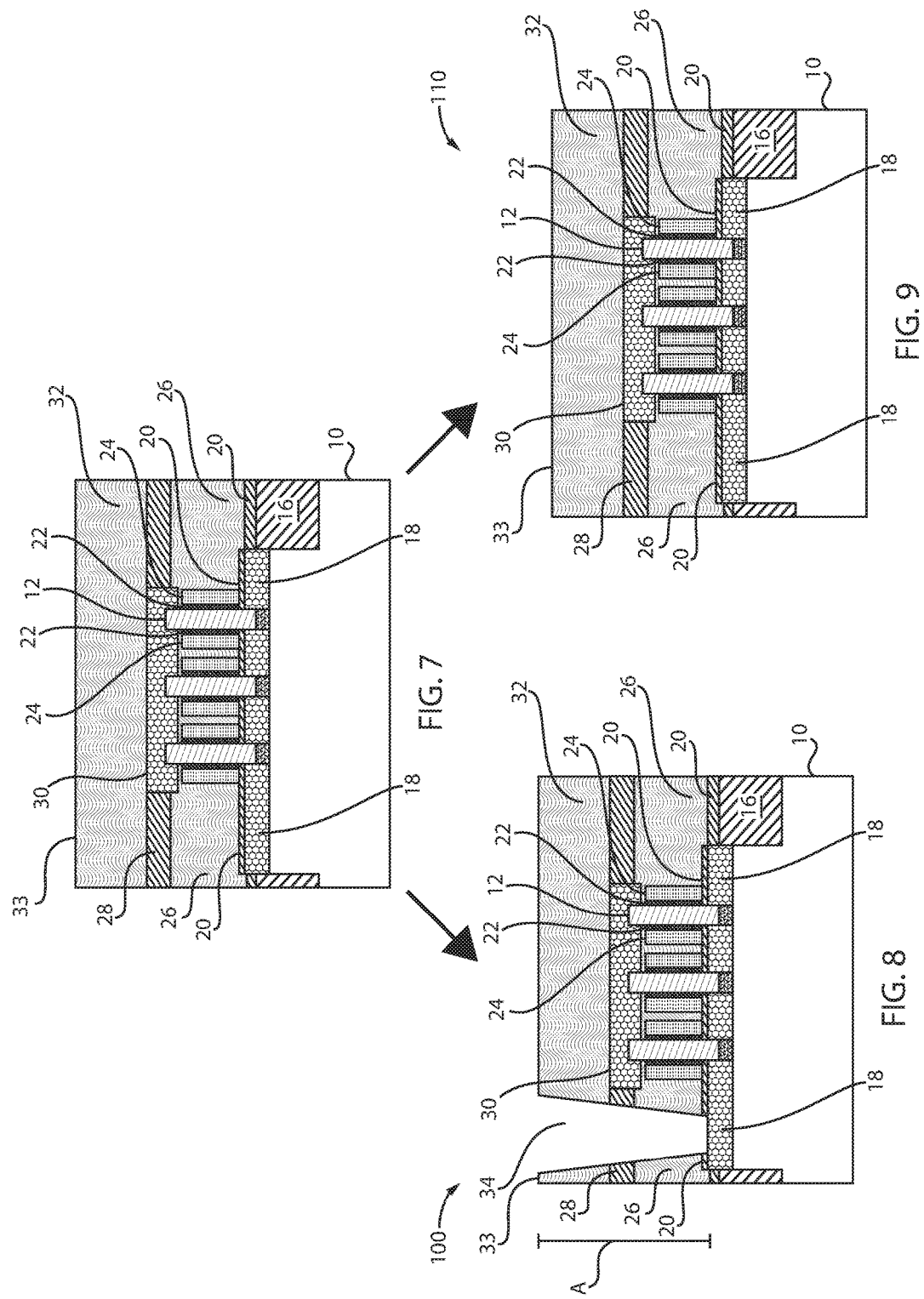

FORMING EDRAM UNIT CELL WITH VFET AND VIA CAPACITANCE

BACKGROUND

Technical Field

The present invention relates generally to semiconductor devices, and more specifically, to forming an eDRAM (embedded dynamic random access memory) unit cell with VFETs (vertical field effect transistors) and via capacitance.

Description of the Related Art

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY

In accordance with an embodiment, a method is provided for forming an embedded dynamic random access memory (eDRAM) device. The method includes forming a FinFET (fin field effect transistor) device having a plurality of fins over a substrate and forming a via cap adjacent the FinFET device by forming a contact trench (or so called via trench) extending into a bottom spacer, depositing a conductive liner within the contact trench, filling the contact trench with an organic dielectric layer (ODL), etching portions of the conductive liner and a portion of the ODL, and removing the ODL. The method further includes depositing a high-k material within the contact trench and depositing a conducting material over the high-k material.

In accordance with another embodiment, a method is provided for forming an embedded dynamic random access memory (eDRAM) device. The method includes forming a FinFET (fin field effect transistor) device having a plurality of fins over a substrate and forming a via cap by forming a trench capacitor, depositing a high-k material within the trench capacitor, depositing a conducting material over the high-k material, and forming a self-aligned contact (CA).

In accordance with another embodiment, an embedded dynamic random access memory (eDRAM) device is provided. The eDRAM includes a FinFET device having a plurality of fins formed over a substrate and a via cap formed adjacent the FINFET device by including a trench capacitor extending into a bottom spacer of the FINFET device, a conductive liner deposited within the trench capacitor, the trench capacitor filled with an organic dielectric layer (ODL) for etching portions of the conductive liner, a high-k material deposited within the trench capacitor, and a conducting material deposited over the high-k material so that a capacitance with two conducting materials is sandwiched by the high-k material.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 7 is a cross-sectional view of the semiconductor device of FIG. 6 where an oxide layer is deposited, in accordance with an embodiment of the present invention;

FIG. 8 is a cross-sectional view of the semiconductor device of FIG. 7 where a contact trench is formed to build an eDRAM (embedded dynamic random access memory) capacitance, in accordance with an embodiment of the present invention;

FIG. 9 is a cross-sectional view of the semiconductor device of FIG. 7 where the vertical FinFET portion of the eDRAM is formed, in accordance with an embodiment of the present invention;

Throughout the drawings, same or similar reference numerals represent the same or similar elements.

DETAILED DESCRIPTION

Figure 1:
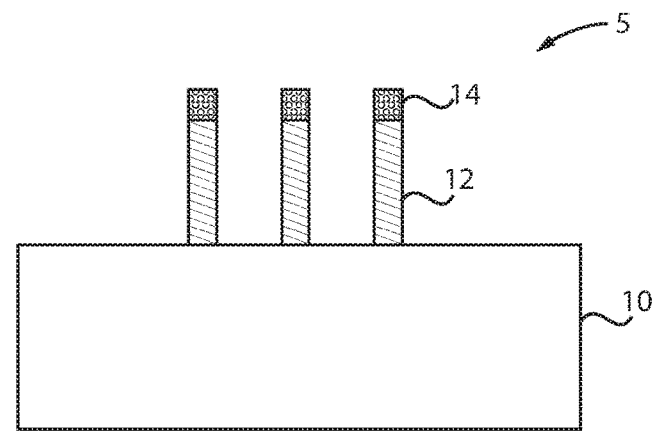
FIG. 1 is a cross-sectional view of a semiconductor structure including a FinFET device having a plurality of fins, in accordance with an embodiment of the present invention.

In one or more embodiments, a method is provided for forming an embedded dynamic random access memory (eDRAM) device. The method includes forming a FinFET (fin field effect transistor) device having a plurality of fins over a substrate and forming a via cap adjacent the FinFET device by forming a contact trench (or so called via trench) extending into a bottom spacer, depositing a conductive liner within the contact trench, filling the contact trench with an organic dielectric layer (ODL), etching portions of the conductive liner and a portion of the ODL, and removing the ODL. The method further includes depositing a high-k material within the contact trench and depositing a conducting material over the high-k material.

In one or more embodiments, a method is provided for forming an embedded dynamic random access memory (eDRAM) device. The method includes forming a FinFET (fin field effect transistor) device having a plurality of fins over a substrate and forming a via cap by forming a trench capacitor, depositing a high-k material within the trench capacitor, depositing a conducting material over the high-k material, and forming a self-aligned contact (CA).

In one or more embodiments, an embedded dynamic random access memory (eDRAM) device is provided. The eDRAM includes a FinFET device having a plurality of fins formed over a substrate and a via cap formed adjacent the FINFET device by including a trench capacitor extending into a bottom spacer of the FINFET device, a conductive liner deposited within the trench capacitor, the trench capacitor filled with an organic dielectric layer (ODL) for etching portions of the conductive liner, a high-k material deposited within the trench capacitor, and a conducting material deposited over the high-k material so that a capacitance with two conducting materials is sandwiched by the high-k material.

In one or more embodiments, an eDRAM fabricated with via trench capacitance integrated with Vertical FIN FET (VTFET) is proposed for the next generation of FIN CMOS technology. The proposed VTFET eDRAM has at least the following advantages: (1) Smallest area in a unit cell, estimated cell area is ~0.0012 um$^2$, (2) No conventional eDRAM deep trench cap in the process, thus reducing trench and CMP (chemical-mechanical planarization) defects, as well as wiring difficulties, (3) No need for BEOL (back end of the line) high-k MIM (metal-insulator-metal) capacitance, thus saving on masks and wiring induced parasitics, (4) The co-plan VIA capacitance with VTFET makes the wiring interconnect easy and reliable, and (5) High-k material can be implemented into the VIA trench for capacitance improvement, thus requiring only one mask for the high-k process.

In one or more embodiments, a FIN vertical CMOS (complementary metal oxide semiconductor) process includes a VTFET and VIA capacitance. The VTFET has bottom and top EPI to form the source and drain, respectively. The VTFET has bottom and top spacer layers to isolate the bottom and top source/drain, respectively. The via cap is a bottom plate of Ti/TiN/Co (titanium/titanium nitride/cobalt) or other conducting material. The bottom plate lands on EPI or implanted source/drain. The via capacitance has stacked SiO$_2$/SiN/high-k as dielectric layer. The via cap top plate is made of Ti/TiN/W (titanium/titanium nitride/tungsten) or any other metal, the via bottom plate is made of Ti/TiN/Co. The cap layout can be parallel bars or serpentine bars or parallel bars evenly distributed on both side of VTFET.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, phosphors, arsenic, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used include ion beam etching, plasma etching or laser ablation.

As used herein, the term "fin structure" refers to a semiconductor material, which can be employed as the body of a semiconductor device, in which a gate structure is positioned around the fin structure such that charge flows down the channel on the two sidewalls of the fin structure and optionally along the top surface of the fin structure. The fin structures are processed to provide FinFETs. A field effect transistor (FET) is a semiconductor device in which output current, i.e., source-drain current, is controlled by the voltage applied to the gate structure to the channel of a semiconductor device. A finFET is a semiconductor device that positions the channel region of the semiconductor device in a fin structure.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Exemplary types of semiconductor devices include planar field effect transistors (FETs), fin-type field effect transistors (FinFETs), nanowire/nanosheet devices, vertical field effect transistors (VFETs), or other devices.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a cross-sectional view of a semiconductor structure including a FinFET device having a plurality of fins, in accordance with an embodiment of the present invention.

A semiconductor structure 5 includes a semiconductor substrate 10 with a plurality of fins 12 formed thereon. A fin cap 14 can be formed over each of the plurality of fins 12. The plurality of fins 12 form a FinFET device.

In one or more embodiments, the substrate 10 can be a semiconductor or an insulator with an active surface semiconductor layer. The substrate 10 can be crystalline, semicrystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

As used herein, a "semiconductor fin" refers to a semiconductor structure including a portion having a shape of a rectangular parallelepiped. The direction along which a semiconductor fin 12 laterally extends the most is herein referred to as a "lengthwise direction" of the semiconductor fin 12. The height of each semiconductor fin 12 can be in a range from 5 nm to 300 nm, although lesser and greater heights can also be employed. The width of each semiconductor fin 12 can be in a range from 5 nm to 100 nm, although lesser and greater widths can also be employed. In various embodiments, the fins 12 can have a width in the range of about 6 nm to about 20 nm, or can have a width in the range of about 8 nm to about 15 nm, or in the range of about 10 nm to about 12 nm. In various embodiments, the fin 12 can have a height in the range of about 25 nm to about 75 nm, or in the range of about 40 nm to about 50 nm.

Multiple semiconductor fins 12 can be arranged such that the multiple semiconductor fins 12 have the same lengthwise direction, and are laterally spaced from each other along a horizontal direction that is perpendicular to the lengthwise direction. In this case, the horizontal direction that is perpendicular to the common lengthwise direction is referred to as a "widthwise direction." Each semiconductor fin 12 includes a pair of parallel sidewalls along the lengthwise direction.

In one embodiment, each semiconductor fin 12 can be formed by lithography and etching. The lithographic step can include forming a photoresist (not shown) atop a substrate including a topmost semiconductor material, exposing the photoresist to a desired pattern of radiation and then developing the exposed photoresist utilizing a conventional resist developer. The pattern within the photoresist is then transferred into the topmost semiconductor material. The etch can include a dry etch process, a chemical wet etch process, or any combination thereof. When a dry etch is used, the dry etch can be a reactive ion etch process, a plasma etch process, ion beam etching or laser ablation. The patterned photoresist material can be removed after transferring the pattern utilizing a conventional stripping process.

In another embodiment of the present application, each semiconductor fin 12 can be formed utilizing a SIT (sidewall image transfer) process. In a typical SIT process, spacers are formed on sidewall surfaces of a sacrificial mandrel that is formed on a topmost semiconductor material of a substrate. The sacrificial mandrel is removed and the remaining spacers are used as a hard mask to etch the topmost semiconductor material of the substrate. The spacers are then removed after each semiconductor fin 12 has been formed. In another embodiment, sequential SIT processes can be utilized to form fins with highly scaled fin width and pitches.

In some embodiments, the fins 12 in the plurality of semiconductor fins can have a fin width between 5 nm and 10 nm. The combination of the fin width and the width of the trough equals, in embodiments, the fin pitch. The fin width and the fin pitch can vary in different areas of a fin array, and can vary from one fin array to another on a semiconductor wafer, according to the design parameters of the integrated circuit that is being made. For example, fins of negatively doped FinFETs can have a different fin size than positively doped FinFETs because of the electrical properties of the materials they are made of.

Figure 2:
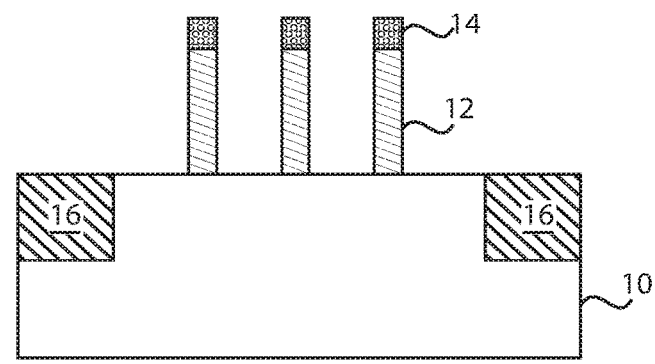
FIG. 2 is a cross-sectional view of the semiconductor structure of FIG. 1 where shallow trench isolation (STI) formation takes place, in accordance with an embodiment of the present invention.

FIG. 2 is a cross-sectional view of the semiconductor structure of FIG. 1 where shallow trench isolation (STI) formation takes place, in accordance with an embodiment of the present invention.

In various embodiments, STI regions 16 are formed within the substrate 10.

The shallow trench isolation (STI) regions 16 are formed by etching a trench in the substrate utilizing a conventional dry etching process such as RIE or plasma etching. The trenches can optionally be lined with a conventional liner material, e.g., silicon nitride or silicon oxynitride, and then CVD or another like deposition process is used to fill the trench with silicon oxide or another like STI dielectric material. The STI dielectric can optionally be densified after deposition. A conventional planarization process such as chemical-mechanical polishing (CMP) can optionally be used to provide a planar structure.

Figure 3:
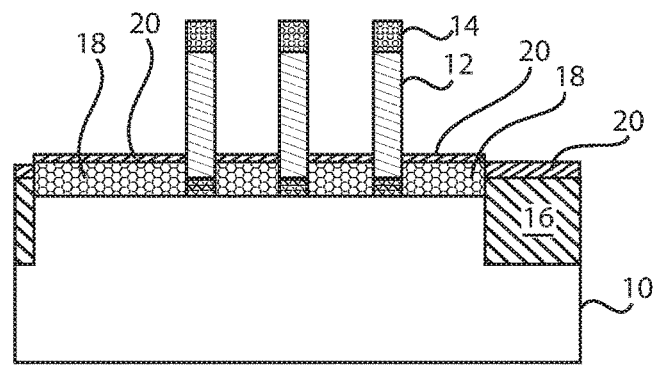
FIG. 3 is a cross-sectional view of the semiconductor structure of FIG. 2 where a bottom spacer is formed, in accordance with an embodiment of the present invention.

FIG. 3 is a cross-sectional view of the semiconductor structure of FIG. 2 where a bottom spacer is formed, in accordance with an embodiment of the present invention.

In various embodiments, a bottom spacer 20 is formed between the plurality of fins 12. An epitaxial layer 18 is then formed thereon. The thickness of the bottom spacer 20 can be greater than the thickness of the epitaxial layer 18.

The bottom spacer 20 is deposited, planarized, and etched back so that the bottom spacer 20 is filled between the fins 12. The bottom spacer 20 can be, e.g., a nitride film. The bottom spacer 20 can be formed adjacent the epitaxial growth 18.

In an embodiment, the bottom spacer 20 can be an oxide, for example, silicon oxide (SiO), a nitride, for example, a silicon nitride (SiN), or an oxynitride, for example, silicon oxynitride (SiON).

The planarization process can be provided by chemical mechanical planarization (CMP). Other planarization process can include grinding and polishing.

In one or more embodiments, the bottom spacer 20 can have a thickness in the range of about 3 nm to about 10 nm, or in the range of about 3 nm to about 5 nm.

Regarding the epitaxial growth 18, the term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a { 100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain regions can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material that provides the source and drain regions.

Examples of silicon including source gasses can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gasses for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from about 550° C. to about 900° C. Although higher temperature typically results in faster deposition, the faster deposition can result in crystal defects and film cracking.

The epitaxial semiconductor material that provides the source and drain regions can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses.

As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source can include diborane ($B_2H_6$). In some embodiments, the epitaxial deposition process for forming the epitaxial semiconductor material for the source and drain regions can continue until the epitaxial semiconductor material that is formed on adjacent fin structures contact one another to form merged epitaxial semiconductor material.

As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

Figure 4:
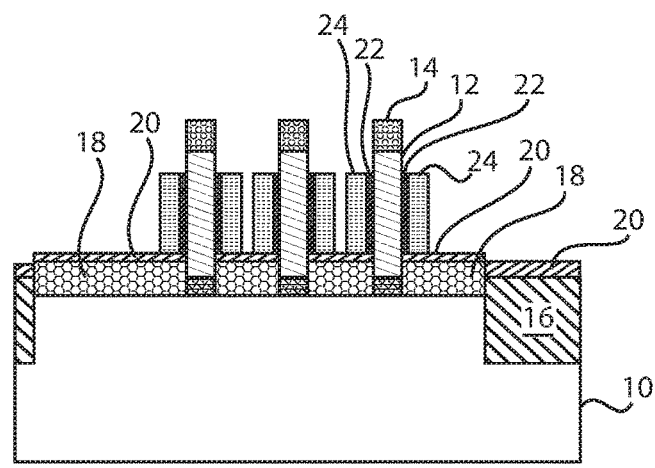
FIG. 4 is a cross-sectional view of the semiconductor structure of FIG. 3 where a high-k metal gate (HKMG) is formed, in accordance with an embodiment of the present invention.

FIG. 4 is a cross-sectional view of the semiconductor structure of FIG. 3 where a high-k metal gate (HKMG) is formed, in accordance with an embodiment of the present invention.

In various embodiments, a high-k dielectric 22 is formed adjacent a portion of the sidewalls of the fins 12. A metal gate 24 is then formed adjacent the high-k dielectric 22. Thus, each of the plurality of fins 12 is sandwiched between a high-k metal gate (HKMG) 22, 24 such that a top portion of the fins 12 is exposed. Additionally, the fin cap 14 is also exposed. The thickness of the HKMG 22, 24 can be approximately equal to the thickness of the plurality of fins 12. However, the thickness of the HKMG 22, 24 can be less than the thickness of the plurality of fins 12.

In various embodiments, the HKMG stack 22, 24 can include but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide(e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide(e.g., $BaTiO_3$), strontium titanium oxide(e.g., $SrTiO_3$), yttrium oxide (e.g., $Y_2O_3$), aluminum oxide (e.g., $Al_2O_3$), lead scandium tantalum oxide (Pb($Sc_xTa_{1-x}$)$O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In various embodiments, the HKMG stack 22, 24 can have a thickness in the range of about 1.5 nm to about 2.5 nm.

Figure 5:
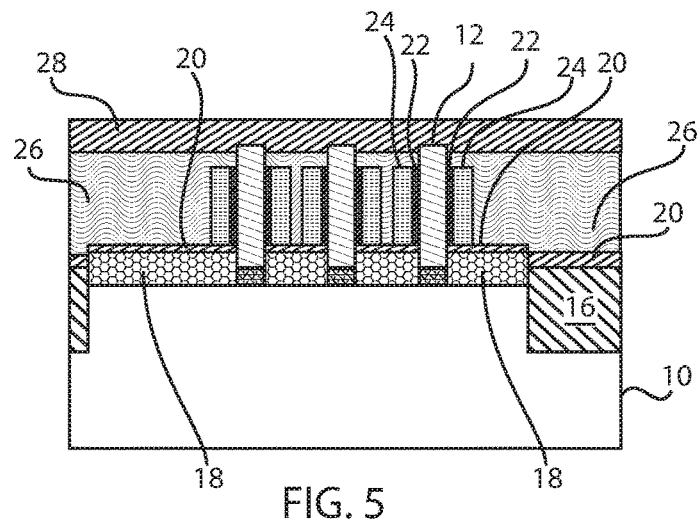
FIG. 5 is a cross-sectional view of the semiconductor device of FIG. 4 where an inter-level dielectric (ILD) oxide fill takes place and a top spacer is formed, in accordance with an embodiment of the present invention.

FIG. 5 is a cross-sectional view of the semiconductor device of FIG. 4 where an inter-level dielectric (ILD) oxide fill takes place and a top spacer is formed, in accordance with an embodiment of the present invention.

In various embodiments, an oxide gap fill takes place. The ILD oxide 26 is planarized. The ILD oxide 26 fills the remaining gap or recess between the fins 12. The ILD oxide 26 extends to a top surface of the fins 12. The ILD oxide 26 does not cover the entirety of the fins 12. Instead, a top portion of the fins 12 remains intact. However, the HKMG 22, 24 is entirely covered by the ILD oxide 26. The ILD oxide fills all the gaps or troughs defined between the plurality of fins 12.

In various embodiments, the height of the ILD oxide fill 26 can be reduced by chemical-mechanical polishing (CMP) and/or etching. Therefore, the planarization process can be provided by CMP. Other planarization process can include grinding and polishing.

In one or more embodiments, the ILD oxide 26 can have a thickness in the range of about 3 nm to about 10 nm, or in the range of about 3 nm to about 5 nm.

The ILD 26 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α—C:H). Additional choices for the ILD 26 include any of the aforementioned materials in porous form, or in a form that changes during processing to or from being porous and/or permeable to being non-porous and/or non-permeable.

In various embodiments, a top spacer fill takes place. The top spacer 28 is a second spacer 28, which is deposited, planarized, and etched back so that the top spacer 28 is filled between the top portion of fins 12. The top spacer 28 can be, e.g., a nitride film. In an embodiment, the top spacer 28 can be an oxide, for example, silicon oxide (SiO), a nitride, for example, a silicon nitride (SiN), or an oxynitride, for example, silicon oxynitride (SiON). The top spacer 28 contacts or engages the top portion of the fins 12.

The planarization process can be provided by chemical mechanical planarization (CMP). Other planarization process can include grinding and polishing.

In one or more embodiments, the top spacer 28 can have a thickness in the range of about 3 nm to about 10 nm, or in the range of about 3 nm to about 5 nm.

Figure 6:
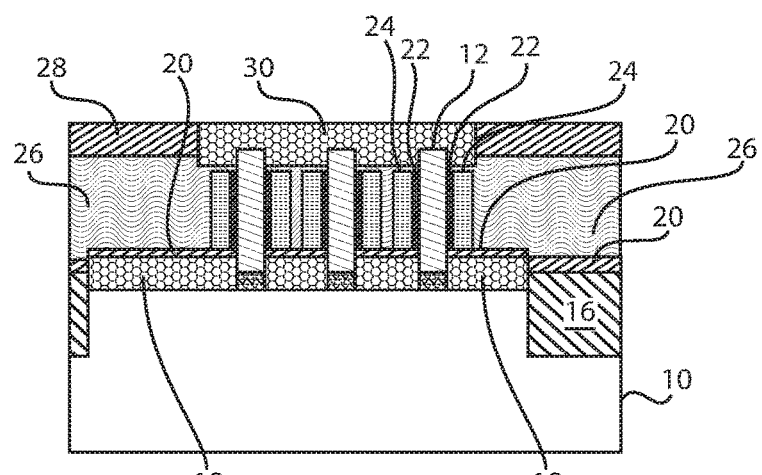
FIG. 6 is a cross-sectional view of the semiconductor device of FIG. 5 where epitaxial growth takes place, in accordance with an embodiment of the present invention.

FIG. 6 is a cross-sectional view of the semiconductor device of FIG. 5 where epitaxial growth takes place, in accordance with an embodiment of the present invention.

In various embodiments, an epitaxial growth layer 30 is formed over the plurality of fins 12, as well as over the HKMG 22, 24. The epitaxial growth layer 30 contacts the top portion of the plurality of fins 12. The epitaxial growth layer 30 can extend up to a top surface of the HKMG 22, 24.

FIG. 7 is a cross-sectional view of the semiconductor device of FIG. 6 where an oxide layer is deposited, in accordance with an embodiment of the present invention.

In various embodiments, an ILD oxide layer 32 is deposited over the top spacer 28 and the epitaxial growth layer 30. The ILD oxide 32 can be planarized to form top surface 33. This step can take place during the middle-of-the-line (MEOL) processing, as described below.

The process is then described with respect to the VIA cap portion and the Vertical Fin FET portion which together form the eDRAM. The VIA cap portion is described with reference to FIGS. 8, 10, 12, 14, 16, 18, 20, 22, and 24, whereas the Vertical Fin FET portion is described with reference to FIGS. 9, 11, 13, 15, 17, 19, 21, 23, and 25. The VIA cap and the FinFET are described separately for sake of clarity. However, it is clear to one skilled in the art that the VIA cap and the FinFET are integrated on a common substrate to form the eDRAM. FIG. 26 below illustrates the final structure where the VIA cap and the FinFET are integrated to form the eDRAM.

During front end-of-the-line processing, a plurality of semiconductor devices (e.g., transistors, resistors, capacitors, and the like) are formed on a semiconductor wafer. The semiconductor devices are then locally interconnected during middle-of-the-line (MEOL) processing to produce an integrated circuit, such as a logic circuit or a memory cell. To enable the local interconnection of the semiconductor devices during MEOL processing, device-level plugs are formed in ohmic contact with the electrically-active areas of the substrate (commonly designated as "RX") and the gate conductors (commonly designated as "PC"), and local interconnect lines are formed in ohmic contact with the device-level plugs. In many cases, such as in certain replacement gate-based processes, the local interconnect lines and device-level plugs can be divided into three general categories: (i) trench-with-late-silicide contacts (referred to herein as "TS contacts") in ohmic contact with RX; (ii) local interconnect lines (referred to herein as "CA contacts") in ohmic contact with the TS contacts; and (iii) plugs in ohmic contact with PC (referred to herein as "CB contacts"). The TS, CA, and CB contacts are collectively referred to herein as the "local contacts." The local contacts can also include shared TS /CB contacts, which provide an electrically-bridged connection to both RX and PC. After formation of the local contacts, the fabrication process advances to back end-of-the-line (BEOL) processing during which additional BEOL layers are formed to globally interconnect the integrated circuits, which are subsequently separated into individual die during wafer dicing.

From one circuit generation or node to the next, critical dimensions are continually reduced and pattern densities are continually increased. To enable the production of highly dense circuit layouts, MEOL patterning processes have been developed wherein multiple masks are utilized to pattern the dielectric layers deposited over the semiconductor devices (e.g., the pre-metal dielectric layer and the overlying inter-metal dielectric layer), which are subsequently filled with metal and polished to produce the local contacts. The CA contacts can thus be printed with a first mask and a first illumination source, while the CB contacts are printed with a second mask and a second illumination source. To achieve an extremely fine resolution, the CA contacts can be printed to have a unidirectional orientation; that is, the CA contacts can be printed as small trench-like structures, which are elongated along the maximum axis of the circuit layout, but extremely narrow along the minimum axis. The CB contacts, however, are typically not so constrained and can be printed to have a bidirectional orientation; that is, the CB contacts can extend along both the maximum and minimum axes of the circuit layout.

In densely-patterned circuits, such as SRAM cells or eDRAM cells included within semiconductor nodes equal to or less than 20 nm, geometry-driven design rules can exclude the usage of copper in the metallization of contact levels containing non-unidirectional local contacts. In the case of conventionally-produced circuits, the bidirectional CB contacts typically extend downward through the local interconnect level in which the CA contacts are formed and into an upper portion of the device-contact level in which the TS contacts are formed.

FIG. 8 is a cross-sectional view of the semiconductor device of FIG. 7 where a contact trench or trench capacitor is formed to build an eDRAM (embedded dynamic random access memory) capacitance, in accordance with an embodiment of the present invention.

In various embodiments, a trench capacitor 34 is formed in the VIA cap 100. The trench capacitor 34 extends a distance "A" through the ILD oxide 32, through the top spacer 28, through the oxide layer 26, and into the bottom spacer 20. The trench capacitor 34 does not penetrate the entire bottom spacer 20 and does not penetrate the substrate 10 at all. The trench capacitor 34 can be selectively formed by an etching process.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

FIG. 9 is a cross-sectional view of the semiconductor device of FIG. 7 where the vertical FinFET portion is formed, in accordance with an embodiment of the present invention.

The vertical FinFET portion 110 remains as is in FIG. 7. No trenches are formed at this time.

Figure 10:
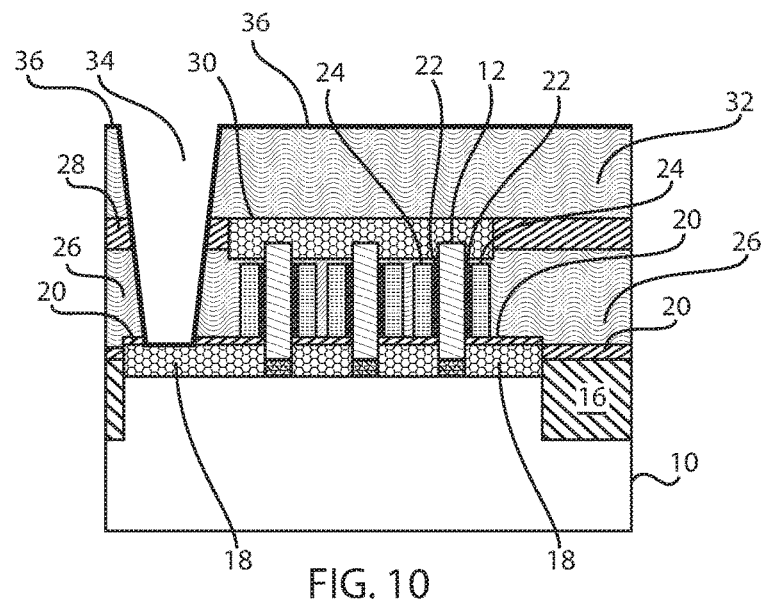
FIG. 10 is a cross-sectional view of the semiconductor device of FIG. 8 where a bottom cap plate is formed over the contact trench of the VIA cap, in accordance with an embodiment of the present invention.

FIG. 10 is a cross-sectional view of the semiconductor device of FIG. 8 where a bottom cap plate is formed over the contact trench or trench capacitor, in accordance with an embodiment of the present invention.

In various embodiments, regarding the via cap, a bottom cap plate 36 is applied within the trench capacitor 34, as well as over the oxide layer 32. The bottom cap plate 36 can be a thin layer that covers the interior of the trench capacitor 34. The bottom cap plate 36 can be, e.g., a Ti/TiN/Co (titanium/titanium nitride/cobalt) liner 36.

Figure 11:
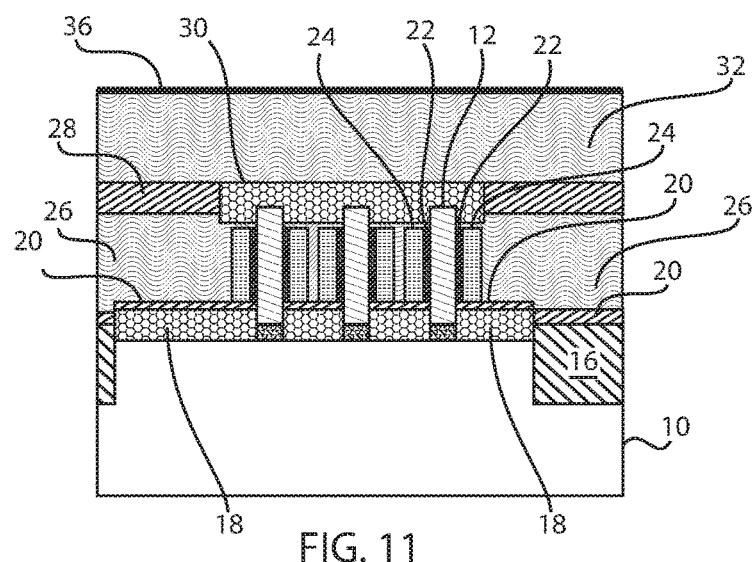
FIG. 11 is a cross-sectional view of the semiconductor device of FIG. 9 where the bottom cap plate is formed over the oxide layer of the vertical FinFET portion of the eDRAM, in accordance with an embodiment of the present invention.

FIG. 11 is a cross-sectional view of the semiconductor device of FIG. 9 where the bottom cap plate is formed over the oxide layer of the vertical FinFET portion, in accordance with an embodiment of the present invention.

In various embodiments, the bottom cap plate 36 is applied over the oxide layer 32 of the vertical FinFET portion 110.

Figure 12:
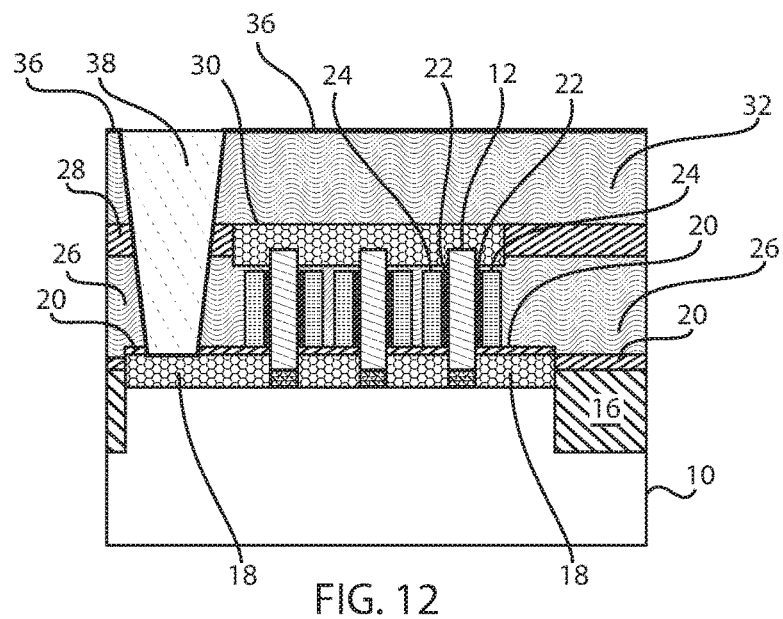
FIG. 12 is a cross-sectional view of the semiconductor device of FIG. 10 where an organic dielectric layer (ODL) fills the bottom cap plate of the contact trench of the VIA cap, in accordance with an embodiment of the present invention.

FIG. 12 is a cross-sectional view of the semiconductor device of FIG. 10 where an organic dielectric layer (ODL) fills the bottom cap plate of the trench capacitor, in accordance with an embodiment of the present invention.

In various embodiments, regarding the via cap, an organic dielectric layer (ODL) 38 is applied within the trench capacitor 34. ODL 38, or other similar masking materials (e.g., an organic planarization layer (OPL)), could be used as a metal chamfer mask. ODL 38 (or OPL) can include a photo-sensitive organic polymer or an etch type organic compound. For instance, the photo-sensitive organic polymer can be polyacrylate resin, epoxy resin, phenol resin, polyamide resin, polyimide resin, unsaturated polyester resin, polyphenylether resin, polyphenylenesulfide resin, or benzocyclobutene (BCB). These materials can be formed within the trench capacitor 34 using spin-on techniques or vapor deposition techniques.

Figure 13:
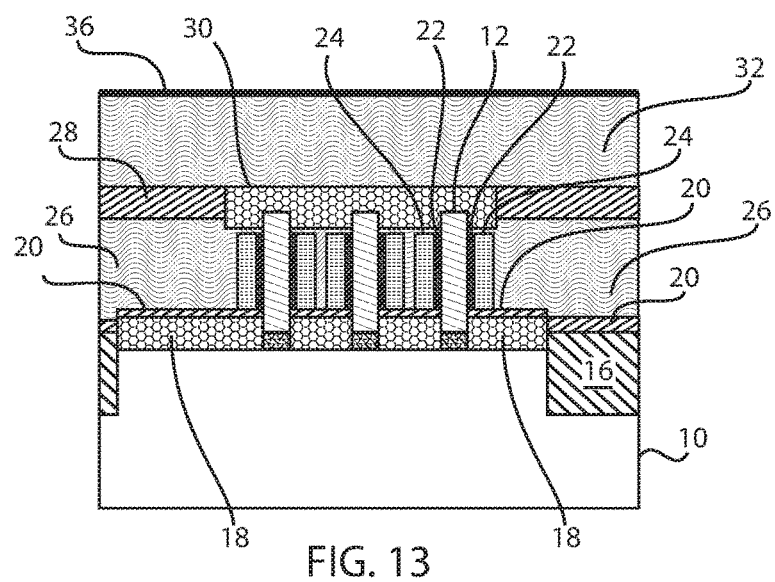
FIG. 13 is a cross-sectional view of the semiconductor device of FIG. 11 where the ODL does not affect the vertical FinFET portion of the eDRAM, in accordance with an embodiment of the present invention.

FIG. 13 is a cross-sectional view of the semiconductor device of FIG. 11 where the ODL does not affect the vertical FinFET portion, in accordance with an embodiment of the present invention.

Application of the ODL 38 occurs only in the trench capacitor 34 of the via cap 100. No ODL is applied to any portions of the vertical FinFET portion 110, as such portion does not include any trenches at this time.

Figure 14:
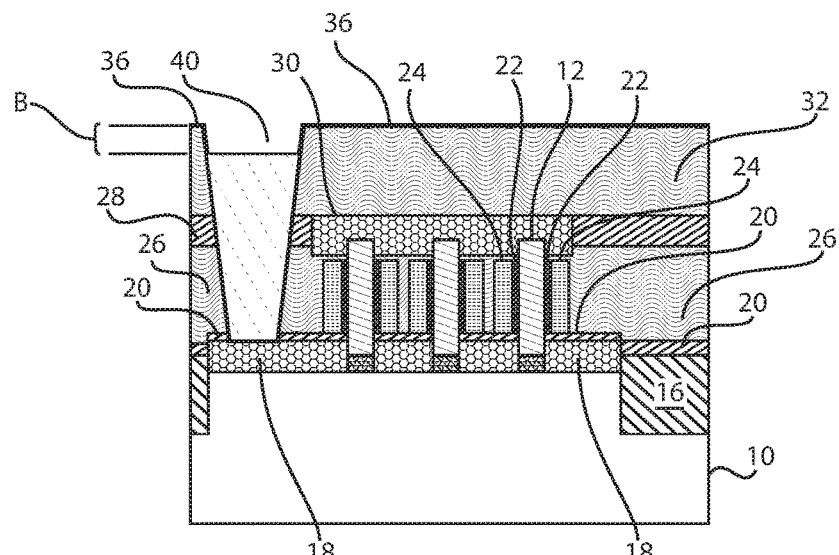
FIG. 14 is a cross-sectional view of the semiconductor device of FIG. 12 where portions of the bottom cap plate and a portion of the ODL are etched, in accordance with an embodiment of the present invention.

FIG. 14 is a cross-sectional view of the semiconductor device of FIG. 12 where portions of the bottom cap plate and a portion of the ODL are etched, in accordance with an embodiment of the present invention.

In various embodiments, regarding the via cap, the bottom cap plate 36 is etched, as well as a portion of the ODL 38, thus creating a recess 40 within the trench capacitor 34. The recess 40 can be, e.g., about 15 nm. The distance "B" of the recess 40 can extend from a top surface of the ODL 38 to a top surface of the oxide layer 32.

Figure 15:
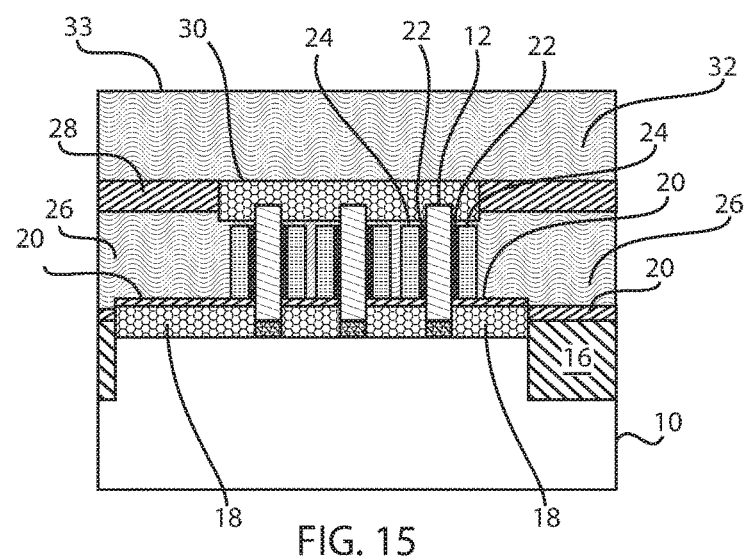
FIG. 15 is a cross-sectional view of the semiconductor device of FIG. 13 where the bottom cap plate is etched away from the oxide layer of the vertical FinFET portion of the eDRAM, in accordance with an embodiment of the present invention.

FIG. 15 is a cross-sectional view of the semiconductor device of FIG. 13 where the bottom cap plate is etched away from the oxide layer of the vertical FinFET portion, in accordance with an embodiment of the present invention.

In various embodiments, the bottom cap plate 36 is also etched from the vertical FinFET portion 110, such that a top surface 33 of the oxide layer 32 is exposed.

Figure 16:
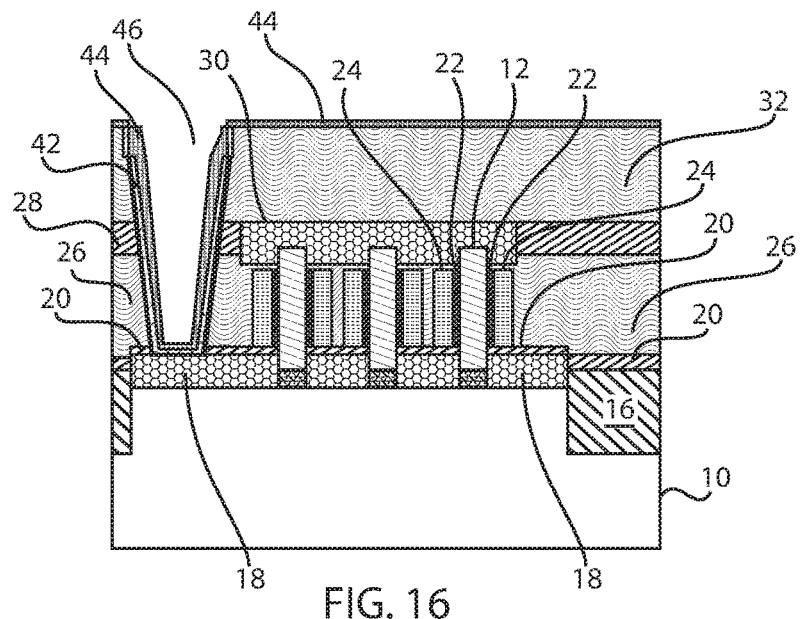
FIG. 16 is a cross-sectional view of the semiconductor device of FIG. 14 where the ODL is removed and a high-k dielectric is deposited for the VIA cap portion of the eDRAM, in accordance with an embodiment of the present invention.

FIG. 16 is a cross-sectional view of the semiconductor device of FIG. 14 where the ODL is removed and a high-k dielectric is deposited, in accordance with an embodiment of the present invention.

In various embodiments, regarding the VIA cap, the ODL 38 is removed, an inter-level (IL) dielectric layer 42 is deposited, and a high-k layer 44 is deposited over the IL layer 42. The IL layer 42 is deposited only within the trench capacitor 34, whereas the high-k layer 44 is deposited within the trench capacitor 34, as well as over the oxide layer 32. Deposition of layers 42, 44 result in the formation of trench 46.

Figure 17:
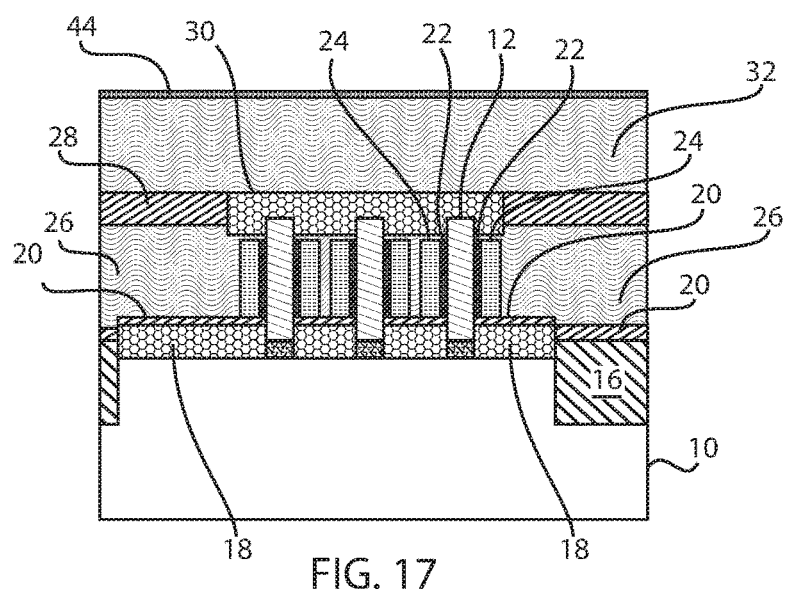
FIG. 17 is a cross-sectional view of the semiconductor device of FIG. 15 where the high-k dielectric rests on the oxide layer of the vertical FinFET portion of the eDRAM, in accordance with an embodiment of the present invention.

FIG. 17 is a cross-sectional view of the semiconductor device of FIG. 15 where the high-k dielectric rests on the oxide layer of the vertical FinFET portion, in accordance with an embodiment of the present invention.

In various embodiments, the high-k layer 44 is also deposited over the oxide layer 32 of the vertical FinFET portion 110.

Figure 18:
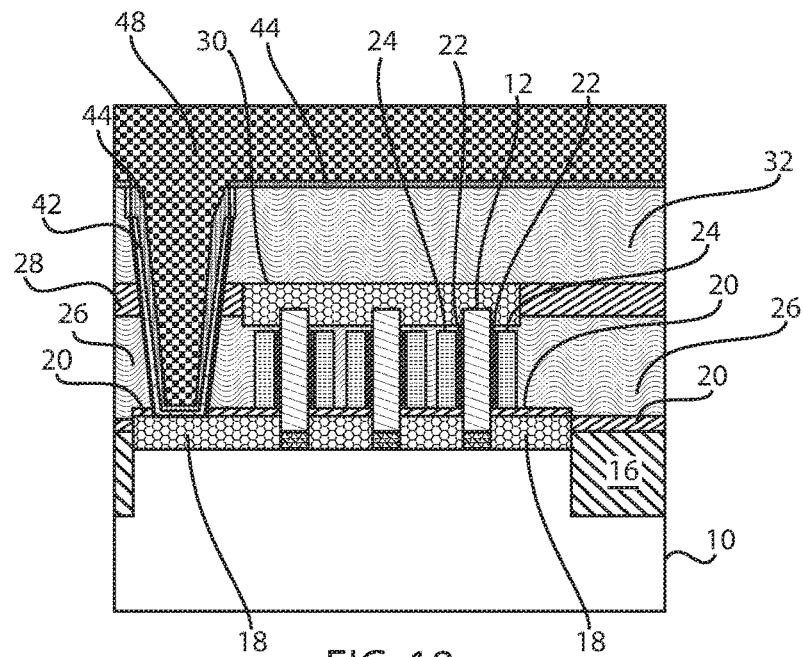
FIG. 18 is a cross-sectional view of the semiconductor device of FIG. 16 where a conducting layer is deposited and used to fill the contact trench for the VIA cap portion of the eDRAM, in accordance with an embodiment of the present invention.

FIG. 18 is a cross-sectional view of the semiconductor device of FIG. 16 where a conducting layer is deposited and used to fill the contact trench, in accordance with an embodiment of the present invention.

In various embodiments, regarding the via cap, a conducting layer 48 is deposited. The conducting layer 48 can be a metal. The metal can be, e.g., Ti/TiN/W (titanium/titanium nitride/tungsten). The conducting layer 48 fills the trench 46 and extends onto the high-k layer 44. The thickness of the conducting layer 48 can be less than the thickness of the oxide layer 32.

Figure 19:
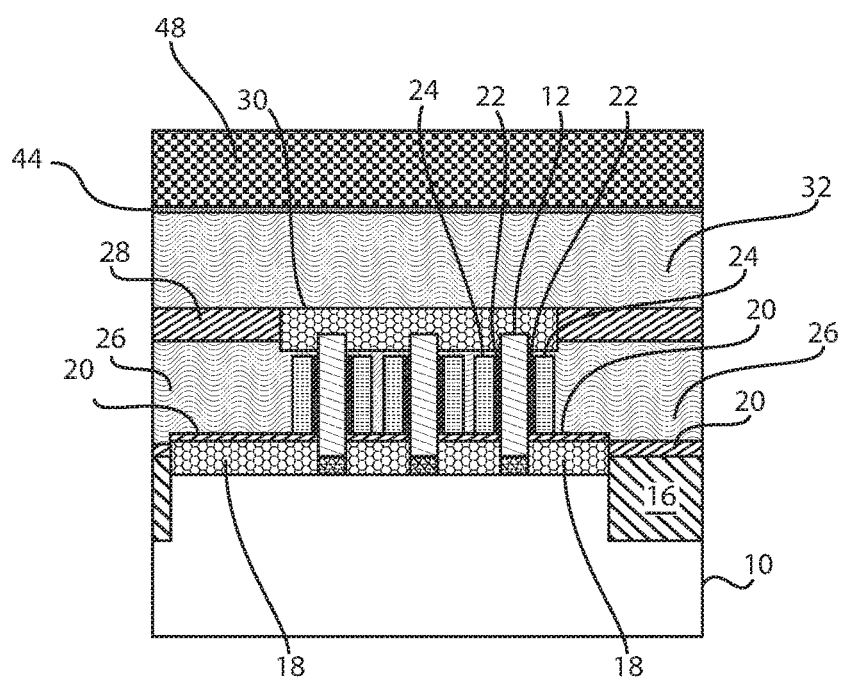
FIG. 19 is a cross-sectional view of the semiconductor device of FIG. 17 where the conducting layer is deposited over the high-k dielectric of the vertical FinFET portion of the eDRAM, in accordance with an embodiment of the present invention.

FIG. 19 is a cross-sectional view of the semiconductor device of FIG. 17 where the conducting layer is deposited over the high-k dielectric of the vertical FinFET portion, in accordance with an embodiment of the present invention.

In various embodiments, the conducting layer 48 is deposited over the high-k layer 44 of the vertical FinFET portion 110.

Figure 20:
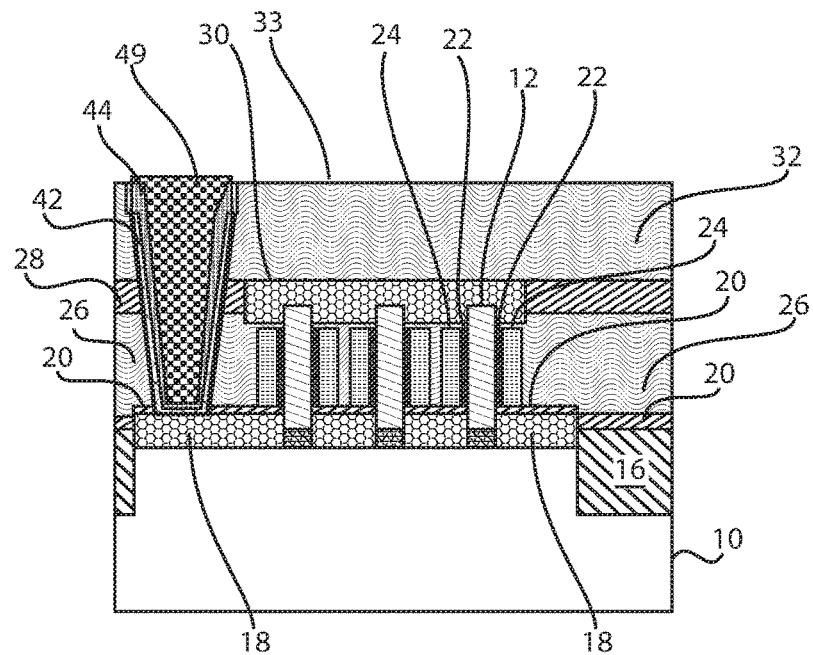
FIG. 20 is a cross-sectional view of the semiconductor device of FIG. 18 where the conducting layer is planarized and the high-k dielectric is removed for the VIA cap portion of the eDRAM, in accordance with an embodiment of the present invention.

FIG. 20 is a cross-sectional view of the semiconductor device of FIG. 18 where the conducting layer is planarized and the high-k dielectric is removed, in accordance with an embodiment of the present invention.

In various embodiments, regarding the via cap, the conducting layer 48 is etched, as well as the high-k layer 44. Thus, conducting material 49 remains within the trench 46.

The planarization process can be provided by chemical mechanical planarization (CMP). Other planarization process can include grinding and polishing.

Figure 21:
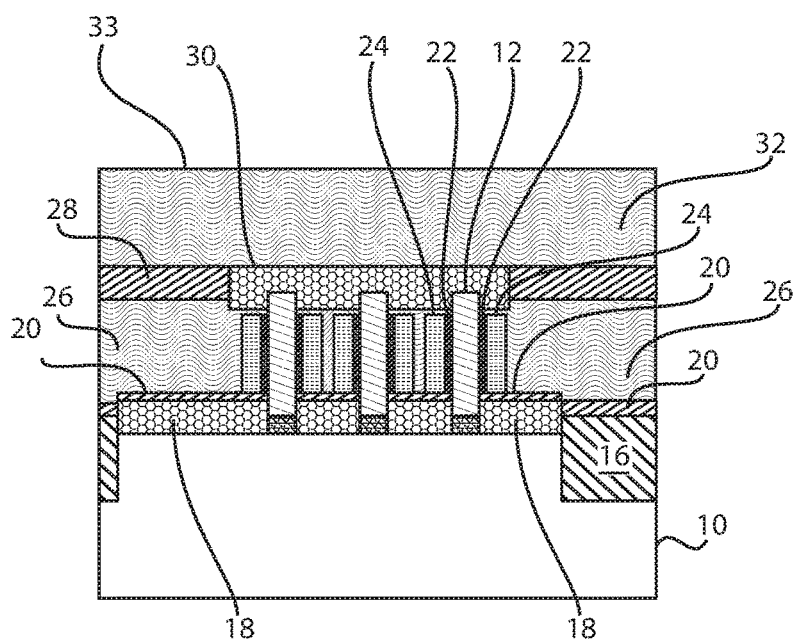
FIG. 21 is a cross-sectional view of the semiconductor device of FIG. 19 where the conducting layer and the high-k dielectric of the vertical FinFET portion of the eDRAM are removed, in accordance with an embodiment of the present invention.

FIG. 21 is a cross-sectional view of the semiconductor device of FIG. 19 where the conducting layer and the high-k dielectric of the vertical FinFET portion are removed, in accordance with an embodiment of the present invention.

In various embodiments, the conducting layer 48 and the high-k layer 44 of the vertical FinFET portion 110 are also removed, thus exposing the top surface 33 of the oxide layer 32.

Figure 22:
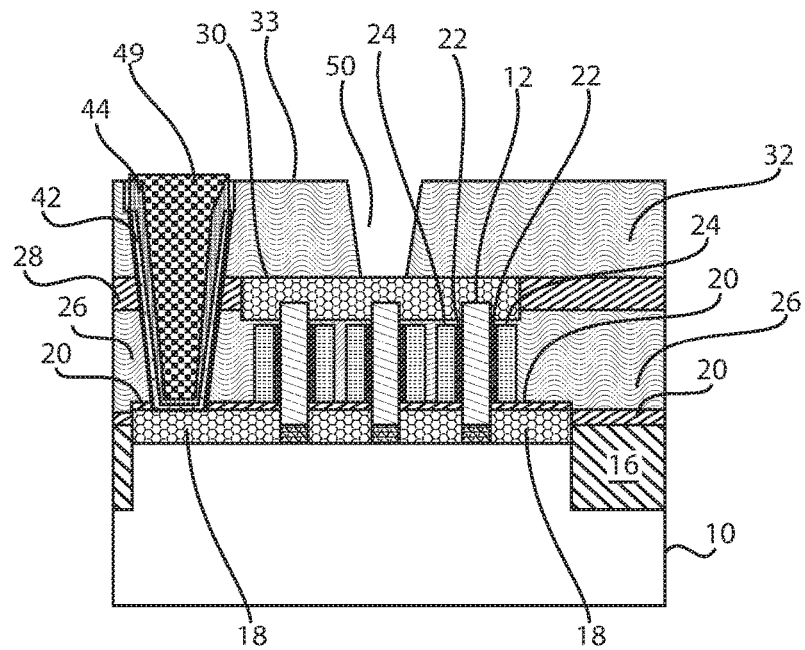
FIG. 22 is a cross-sectional view of the semiconductor device of FIG. 20 where a trench is formed to define a self-aligned contact (CA) for the VIA cap portion of the eDRAM, in accordance with an embodiment of the present invention.

FIG. 22 is a cross-sectional view of the semiconductor device of FIG. 20 where a trench is formed to define a self-aligned contact (CA), in accordance with an embodiment of the present invention.

In various embodiments, a trench 50 is formed. The trench 50 extends into the oxide layer 32. The oxide layer 32 is penetrated to expose the top surface of the epitaxial growth layer 30. The trench 50 is aligned with the plurality of fins 12.

Figure 23:
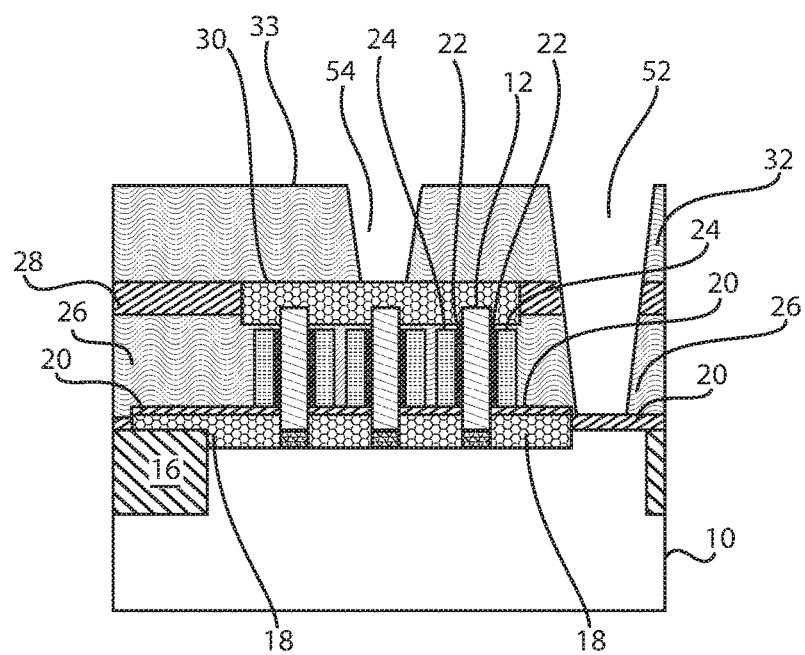
FIG. 23 is a cross-sectional view of the semiconductor device of FIG. 21 where first and second trenches are formed in the vertical FinFET portion to define a CA contact and a trench with silicide (TS) contact, in accordance with an embodiment of the present invention.

FIG. 23 is a cross-sectional view of the semiconductor device of FIG. 21 where first and second trenches are formed in the vertical FinFET portion to define a CA contact and a trench with silicide (TS) contact, in accordance with an embodiment of the present invention.

In various embodiments, a first trench 52 and a second trench 54 are formed in the vertical FinFET portion 110. The first trench extends into the bottom spacer 20, whereas the second trench extends into the oxide layer 32, such that a top surface of the epitaxial grown layer 30 is exposed. The first trench 52 can form the TS contact, whereas the second trench 54 can form the CA contact. The CA contact is aligned with the plurality of fins 12.

Figure 24:
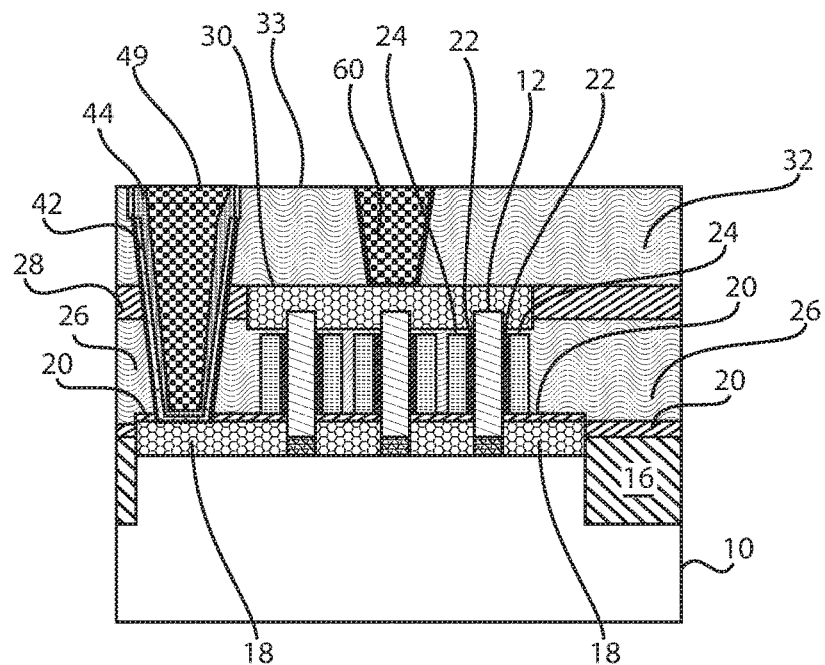
FIG. 24 is a cross-sectional view of the semiconductor device of FIG. 22 where the trench is filled with a conducting material to form a CA contact for the VIA cap, in accordance with an embodiment of the present invention.

FIG. 24 is a cross-sectional view of the semiconductor device of FIG. 22 where the trench is filled with a conducting material to form a CA contact for the VIA cap, in accordance with an embodiment of the present invention.

In various embodiments, the trench 50 of the via cap 100 is metallized by filling it with a metal 60, e.g., Tungsten (W). Metallization can be performed by any suitable metal deposition technique, including, but not limited to, sputtering, evaporating, electroplating, electroless plating and combinations comprising at least one of the foregoing metal deposition techniques.

The metal 60 can be planarized. The planarization process can be provided by chemical mechanical planarization (CMP). Other planarization process can include grinding and polishing.

Figure 25:
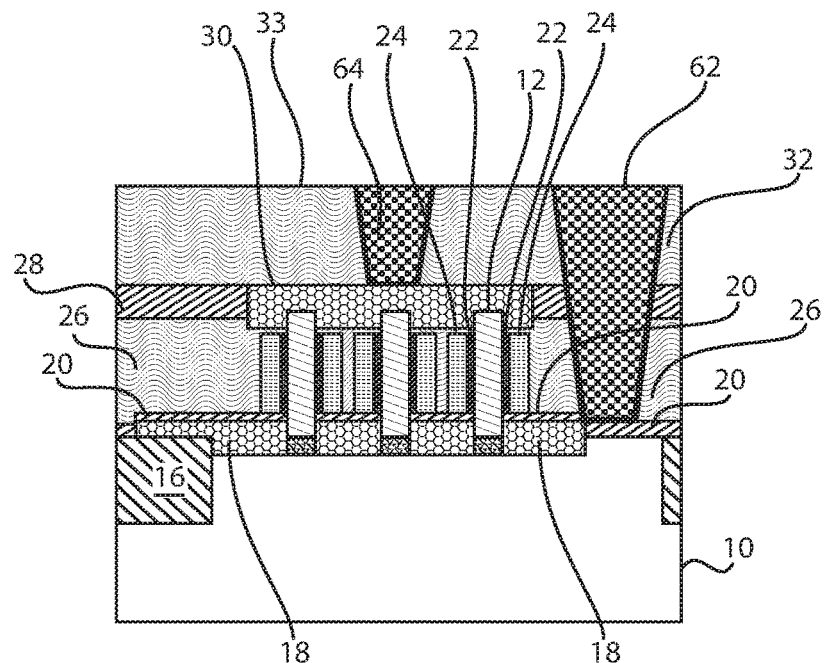
FIG. 25 is a cross-sectional view of the semiconductor device of FIG. 23 where the first and second trenches are filled with a conducting material to form the CA and TS contacts in the vertical FinFET portion, in accordance with an embodiment of the present invention.
Figure 26:
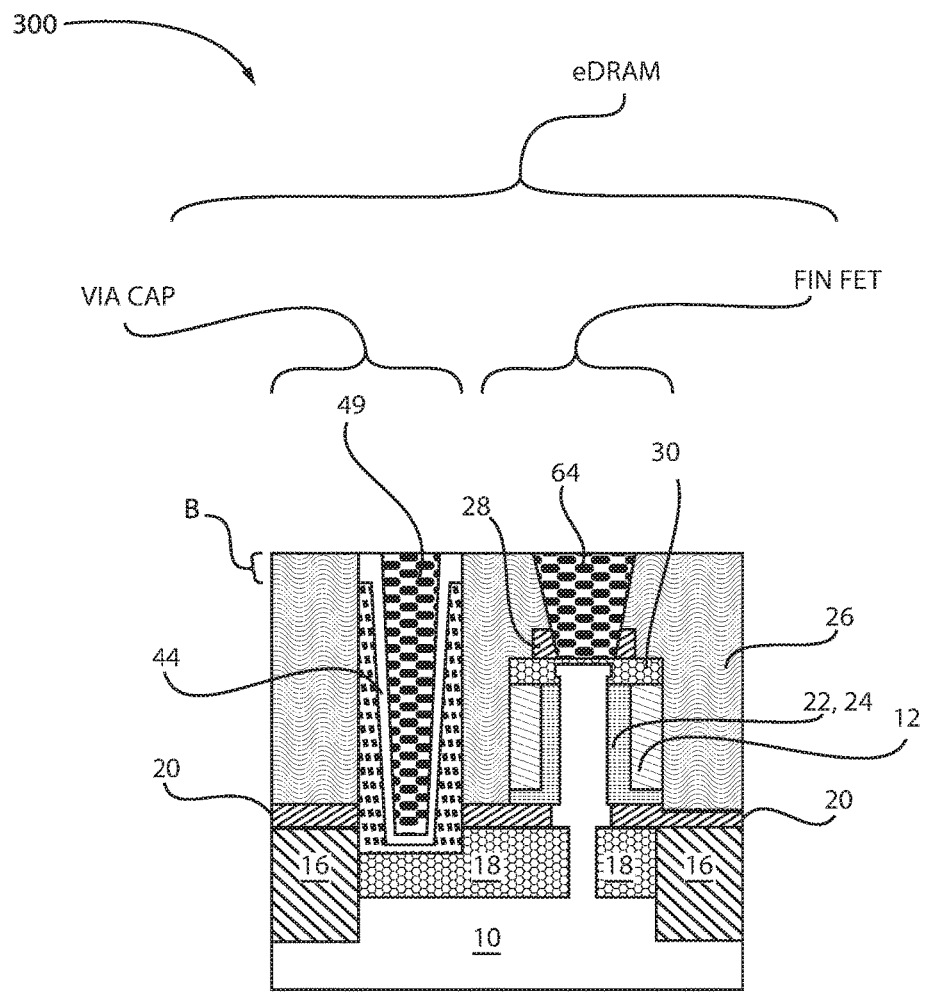
FIG. 26 is a cross-sectional view of the semiconductor device of FIGS. 24 and 25 depicting integration of the VIA cap and the FinFET device to form the eDRAM, in accordance with an embodiment of the present invention.

FIG. 25 is a cross-sectional view of the semiconductor device of FIG. 23 where the first and second trenches are filled with a conducting material to form the CA and TS contacts in the vertical FinFET portion, in accordance with an embodiment of the present invention.

In various embodiments, the first trench 52 and the second trench 54 of the vertical FinFET portion 110 are filled with metals 62, 64 to form TS and CA contacts, respectively. The TS and CA contacts are metallized with a metal, e.g., Tungsten (W). Metallization can be performed by any suitable metal deposition technique, including, but not limited to, sputtering, evaporating, electroplating, electroless plating and combinations comprising at least one of the foregoing metal deposition techniques.

The metals 62, 64 can be planarized. The planarization process can be provided by chemical mechanical planarization (CMP). Other planarization process can include grinding and polishing.

FIG. 26 is a cross-sectional view of the semiconductor device of FIGS. 24 and 25 depicting integration of the VIA cap and the FinFET device to form the eDRAM, in accordance with an embodiment of the present invention.

In conclusion, a semiconductor device 300 is constructed where the VIA cap of FIG. 24 is integrated with the vertical FinFET of FIG. 25.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated to form an eDRAM (embedded dynamic random access memory) unit cell with VFETs (vertical field effect transistors) and VIA capacitance (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. An embedded dynamic random access memory (eDRAM) device, comprising:
    a FinFET (fin field effect transistor) device having a plurality of fins formed over a substrate; and
    a via cap formed adjacent the FinFET device by including:
        a trench capacitor extending to and directly contacting a top surface of an epitaxial layer, the epitaxial layer directly contacting a top surface of the substrate and sidewalls of each of the plurality of fins;
        a conductive liner deposited within the trench capacitor;
        a high-k material deposited within the trench capacitor; and
        a conducting material deposited over the high-k material.

2. The device of claim 1, wherein a high-k dielectric is formed adjacent the plurality of fins.

3. The device of claim 2, wherein an oxide layer is deposited over the plurality of fins and a top spacer is deposited over the oxide layer.

4. The device of claim 3, wherein a first epitaxial region is formed at one end of the plurality of fins and a second epitaxial region is formed at the other end of the plurality of fins to form source and drain regions.

5. The device of claim 4, wherein the top and bottom spacers isolate the source and drain regions by the via cap.

6. The device of claim 1, wherein the conductive liner is titanium/titanium nitride/cobalt (Ti/TiN/Co).

7. The device of claim 1, wherein the conducting material is titanium/titanium nitride/tungsten (Ti/TiN/W).

8. The device of claim 1, wherein a self-aligned contact (CA) is formed.

9. The device of claim 8, wherein the CA contact is filled with the conducting material used to fill the high-k material.

10. An embedded dynamic random access memory (eDRAM) device, comprising:
    a FinFET (fin field effect transistor) device having plurality of fins formed over a substrate; and
    a via cap formed adjacent the FinFET device by including:
        a trench capacitor extending to and directly contacting a top surface of an epitaxial layer, the epitaxial layer directly contacting a top surface of the substrate and sidewalls of each of the plurality of fins;
        a high-k material deposited within the trench capacitor;
        a conducting material deposited over the high-k material; and
        a self-aligned contact (CA) formed thereon.

11. The device of claim 10, wherein a conductive liner is deposited within the trench capacitor before depositing the high-k material.

12. The device of claim 10, wherein the CA contact is filled with the conducting material used to fill the high-k material.

13. The device of claim 10, wherein the conducting material is titanium/titanium nitride/tungsten (Ti/TiN/W).

14. The device of claim 10, wherein a first epitaxial region is formed at one end of the plurality of fins and a second epitaxial region is formed at the other end of the plurality of fins to form source and drain regions.

15. The device of claim 14, wherein top and bottom spacers isolate the source and drain regions by the via cap.

* * * * *